United States Patent
Zhang

(10) Patent No.: US 6,521,108 B1
(45) Date of Patent: Feb. 18, 2003

(54) DIFFUSION BONDED SPUTTER TARGET ASSEMBLY AND METHOD OF MAKING SAME

(75) Inventor: Hao Zhang, Vancouver, WA (US)

(73) Assignee: Tosoh SMD, Inc., Grove City, OH (US)

(*) Notice: Subject to any disclaimer, the term of this patent is extended or adjusted under 35 U.S.C. 154(b) by 0 days.

(21) Appl. No.: 09/868,407

(22) PCT Filed: Dec. 17, 1999

(86) PCT No.: PCT/US99/30213
§ 371 (c)(1),
(2), (4) Date: Jun. 14, 2001

(87) PCT Pub. No.: WO00/40770
PCT Pub. Date: Jul. 13, 2000

Related U.S. Application Data

(60) Provisional application No. 60/114,357, filed on Dec. 29, 1998.

(51) Int. Cl.$^7$ .................. C23C 14/34; B23K 31/00; B23K 20/00; B23K 20/02; B21D 39/00
(52) U.S. Cl. .............. 204/298.13; 204/298.12; 428/650; 428/652; 228/115; 228/116; 228/164; 228/165; 228/174; 228/203; 228/194; 419/49
(58) Field of Search ............. 204/298.12, 298.13; 428/652, 650; 228/115, 116, 164, 165, 174, 203, 194; 419/49

(56) References Cited

U.S. PATENT DOCUMENTS

| | | |
|---|---|---|
| 5,230,459 A | 7/1993 | Mueller et al. |
| 5,234,487 A | 8/1993 | Wickersham, Jr. et al. |
| 5,693,203 A | 12/1997 | Ohhashi et al. |
| 5,803,342 A | 9/1998 | Kardokus |
| 5,836,506 A * | 11/1998 | Hunt et al. .................. 228/172 |
| 6,071,389 A * | 6/2000 | Zhang .................. 204/298.12 |
| 6,164,519 A * | 12/2000 | Gilman et al. ............... 228/107 |
| 6,176,944 B1 * | 1/2001 | Snowman et al. ........... 148/121 |
| 6,372,104 B1 * | 4/2002 | Schlott et al. .......... 204/298.13 |
| 2001/0001438 A1 * | 5/2001 | Cole et al. ............. 204/298.13 |
| 2002/0003010 A1 * | 1/2002 | Shah et al. .................. 148/518 |

FOREIGN PATENT DOCUMENTS

| | | |
|---|---|---|
| EP | 0590904 A1 | 9/1993 |
| JP | 54-93454 A * | 7/1979 |
| JP | 61-183465 A * | 8/1986 |
| WO | 9508438 | 3/1995 |
| WO | 9841669 | 9/1998 |

OTHER PUBLICATIONS

T. Enjo et al., "Diffusion Welding of Copper to Aluminum," *Transactions of JWRI*, vol. 8, No. 1, Mar. 31, 1979, pp. 77–84.

R.S. Rosen et al., "Diffusion Welding of Silver Interlayer Coated onto Base Metals by Planar–Magnetron Sputtering," *J. Vac.Sci.Technol. A.*, vol. 8, Jan./Feb. 1990, pp. 19–29.

Ser. No. 09/226,798 filed Jan. 07, 1999, Bolcavage et al.

* cited by examiner

*Primary Examiner*—Alan Diamond
(74) *Attorney, Agent, or Firm*—Wegman, Hessler & Vanderburg

(57) ABSTRACT

Low temperature diffusion bonding methods and target/backing plate assemblies bonded by the methods are disclosed. In accordance with the methods, copper and/or cobalt targets are bonded to backing plate members via the use of an interlayer selected from the group consisting of group Ib or group VIII metals. The interlayer is interposed between intended bonding surfaces of the target and the backing plate, and the assembly is diffusion bonded at low temperatures of about 190° C.–400° C. The method results in increased tensile strength of the bonded assembly while not, in the case of copper targets, resulting in undesirable grain growth. When cobalt targets are bonded in accordance with the invention, desirable magnetic properties, such as magnetic pass through flux, are maintained while a strong bond is achieved.

16 Claims, 3 Drawing Sheets

DIFFUSION BONDED SPUTTER TARGET ASSEMBLY AND METHOD OF MAKING SAME

CROSS-REFERENCE TO RELATED APPLICATIONS

This application is a 371 (1) International PCT application PCT/US99/30213 filed Dec. 17, 1999, and published under PCT 21 (2) in the English language which claims the benefit of (2) U.S. provisional application Ser. No. 60/114,351 filed Dec. 29, 1998.

BACKGROUND OF THE INVENTION

The present invention generally relates to a design for and a method of making a sputter target assembly for physical vapor deposition thin film coating. More particularly, the invention relates to Cu or Co metal targets and their alloys that are diffusion bonded to a backing plate assembly with an intermediate, bond facilitating layer of a group Ib or group VIII metal interposed between the bonded surfaces of the target and backing plate.

Cathodic sputtering is widely used for depositing thin layers or films of materials from sputter targets onto desired substrates. Basically, a cathode assembly including the sputter target is placed together with an anode in a chamber filled with an inert gas, preferably argon. The desired substrate is positioned in the chamber near the anode with a receiving surface oriented normally to a path between the cathode assembly and the anode. A high voltage electric field is applied across the cathode assembly and the anode.

Electrons ejected from the cathode assembly ionize the inert gas. The electrical field then propels positively charged ions of the inert gas against a sputtering surface of the sputter target. Material dislodged from the sputter target by the ion bombardment traverses the chamber and deposits on the receiving surface of the substrate to form a thin layer or film.

Sputter targets of high-purity metals or metal alloys attached to aluminum- or copper-based backing plates are typically used to deposit thin films on substrates, such as, for example, semiconductor devices. These sputter target assemblies provide mechanical and electrical attachment of the target material to the sputter apparatus, provide vacuum sealing surfaces to maintain proper sputter chamber environmental conditions, and typically provide a path of heat removal for effective cooling of the target material during sputter deposition.

The sputter target is heated during the sputtering process by the kinetic energy of the bombarding gas ions imparted to the sputtering target as thermal energy. This heat is dissipated by thermal exchange with a cooling fluid typically circulated beneath or around the backing plate which is bonded to the sputter target along an interface opposite from the sputtering surface.

Copper and its alloys have seen increasing use as interconnect material for ULSI metallization due to their high electrical conductivity and excellent migration resistance. Cu interconnects result in fast speed, better performance and more reliable interconnect devices. High purity copper targets are used to sputter deposit Cu thin films on Si wafers to manufacture these advanced integrated circuit devices. As such, the Cu target plays an important role in determining many Cu film properties such as film uniformity and consistency, electrical conductivity, step coverage, etc.

Presently, Cu targets are bonded to lightweight and highly heat conductive backing plates by solder bonding or high temperature diffusion bonding. These joining techniques are not without problems, however. For example, the bond strength of a solder bonded Cu target/backing plate is typically low, and it further decreases as the temperature increases when the target is being sputtered. Additionally, typically used solders have low melting points and high vapor pressures, and they accordingly constitute potential sources of wafer contamination during the sputtering process. Typical solder bonding results in sputter/backing plate assembly bond strengths of about 4,000 psi (28 Mpa).

Diffusion bonding is a preferred method for bonding sputter targets to backing plates. However, diffusion bond strengths between the Cu targets and their associated Al or Al alloy backing plates are extremely weak due to the fact that Cu and Al form several brittle compounds between them. In this regard, typical bond strengths between Cu and Al or Al alloys range from about 2,000 psi (14 Mpa) to about 5,000 psi (35 Mpa), although one commercially available Cu/Al target backing plate assembly reputedly has a bond strength of between 6.2–7.9 ksi (42 Mpa–54.4 Mpa).

To overcome this problem, it has been suggested by some to try high temperature diffusion bonding of Cu to Al backing plates with a Ni interlayer. This method reportedly results in a high bond strength, but the high temperatures used (i.e. about 400–600° C.) result in undesirable target grain growth via secondary recrystallization. This is highly undesirable and adversely affects sputter performance. As a result, films sputtered with such target/backing plate assemblies suffer from poor film uniformity and sheet resistance fluctuation. This type of bonding also may result in an undesirable increase in particulate emission during the sputtering process.

Cobalt targets are also commonly used in the sputtering process to form a variety of films for semiconductor metallizations, salicide layers on submicron semiconductors and low resistivity contacts. In these applications it is important that the desired magnetic properties of the sputter targets be maintained to provide enhanced plasma uniformity in the sputter chamber to result in uniform coating deposition. High temperature bonding of Co targets to their associated backing plates causes degradation in the magnetic properties of the Co such as permeability and pass through flux, causing a significant increase in permeability and decrease in pass through flux.

Accordingly, there is a need in the art for a method of bonding Cu targets to associated backing plates that will result in acceptable target to backing plate tensile strength that does not result in significant Cu target grain growth.

Similarly, there is a need in the art to provide a method for bonding Co targets to associated backing structures that will provide sufficient bond or tensile strength between target and backing plate while not adversely affecting the desired magnetic properties of the Co target.

SUMMARY OF THE INVENTION

These and other objects are met by the methods and structural combinations herein disclosed.

I have found that Cu and Co targets (and targets comprising alloys of Cu and Co) can be successfully diffusion bonded to associated backing plate members without, in the case of a Cu target, resulting in significant Cu grain growth during bonding, and, when a Co target is bonded, without resulting in diminution of the target's pass through flux and magnetic permeability.

The disclosed methods are used to join sputtering targets to backing plates by using diffusion bonding and an Ag or an Ag alloy (or other IB elements like Au and its alloys, or VIII elements like Pd, Pt and their alloys) interlayer between them. As a result, undesirable secondary recrystallization, abnormal grain growth and degradation in crystallographic texture are minimized while the original microstructural and physical properties of the targets are retained. With an Ag or Ag alloy interlayer, the diffusion bonding temperatures can be reduced to between 190° and 400° C.

In this method, high bond strength of 13,000 psi (90 Mpa) is achieved between a Cu target and Al alloy backing plate by utilizing proper parameters including surface finish and surface cleaning of parent metals, bonding grooves or surface roughness, interlayer thickness, bonding temperature and time. The Ag or Ag alloy interlayer can be deposited on the desired bonding surface of either the target or backing plate or both by sputter deposition, electroplating, plasma coating and other methods including placement of a foil layer along the desired interfacial bonding area. The desired Ag or Ag alloy interlayer thickness is between about 1 microns to 100 microns. Bonding of the target and backing plate can be accomplished using one of a variety of methods including hot isostatic pressing (HIP), vacuum pressing, pressing or other methods at low-temperatures or intermediate temperatures.

Co and Cu targets (and alloys including such metals) may be bonded to Al and Al alloy backing plates or to Cu and/or Cu alloy backing plates in accordance with the invention.

The invention will be further described in conjunction with the appended drawings and following detailed description of the invention.

DETAILED DESCRIPTION OF THE PREFERRED EMBODIMENT

Figure 1:
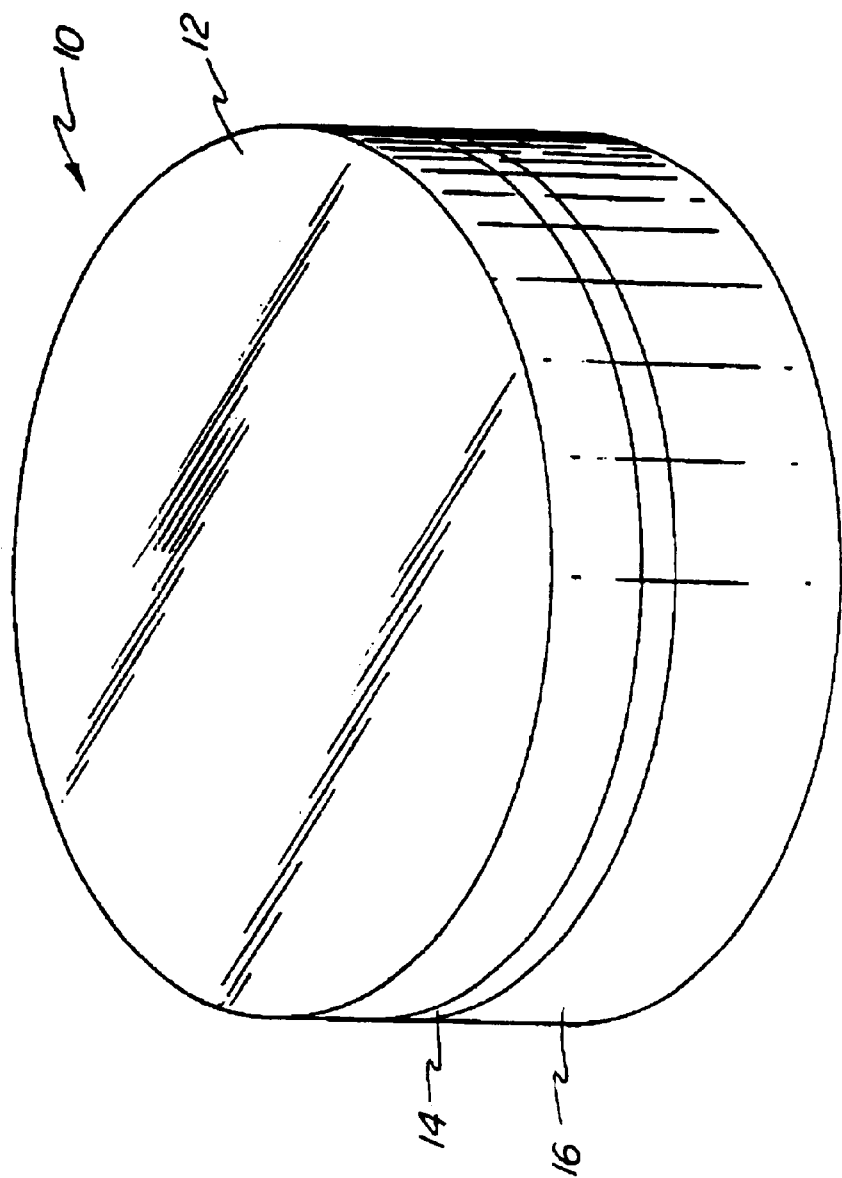
FIG. 1 is a schematic perspective view of a sputter target/backing plate assembly made in accordance with the invention.

In accordance with the invention, a target and backing plate are prepared. A bond interlayer is then interposed between the intended bonding surfaces of both the target and backing plate to form an assembly. The bond interlayer comprises a metal selected from the group Ib and group VIII metals and alloys thereof.

Then, the assembly is consolidated under temperature and pressure conditions chosen to diffusion bond the target and backing plate together along the interface of the target bonding and backing plate bonding surfaces. The bond interlayer may be provided in the form of a metallic foil, or it can be provided by coating of one or both of the bonding surfaces. Exemplary coating methods include sputter coating, plasma spraying and electroplating. At present, it is preferred to sputter coat the interlayer.

Temperatures utilized during the diffusion bonding are on the order of 190° C. - about 400° C. with a more preferred range of about 250° C.–400° C. Pressures that may be utilized are on the order of about 10–30 ksi with a more preferred range of about 10–20 ksi. The interlayer is preferably composed of silver or silver based alloys.

The bonding surfaces may first be cleaned by a variety of well known techniques including the application of degreasing compositions such as acetone, isopropyl alcohol, soap and water, etc. to the requisite surfaces to remove machining oils, fingerprints, and the like.

One or both of the bonding surfaces of the target and backing plate may then be given a roughening treatment prior to bonding. That is, one of the surfaces can be treated in accordance with the disclosure of U.S. Pat. No. 5,230,459 in which grooves are provided in a closed loop configuration or pattern in one of the surfaces to be diffusion bonded. Additionally, a roughening treatment may be provided on one or both of the bonding surfaces by other well known techniques, including particle blasting, shot peening, etching, steel brush abrasion, or other methods.

After the optional cleaning and roughening steps, the desired interlayer is applied to one or both of the intended interfacial bonding surfaces. In the case in which copper targets are to be bonded to Al or Al alloys such as Al 6061, a steel brush is used to roughen the backing plate with the interlayer applied to the bonding surface of the target.

Diffusion bonding of the target, interlayer, and backing plate may be accomplished by a variety of techniques including HIPing and vacuum hot pressing, provided that the diffusion bonding is accompanied by the low temperature parameters set forth above. As to the HIPing technique, a can assembly is placed in a HIP chamber and is subjected to the HIPing process at a predetermined temperature and pressure for a selected time period. The can assembly is typically subjected to equal pressure from all sides by means of a pressurizing gas, usually argon. The particular conditions used for the HIP process are selected to meet the requirements necessary to achieve a sound diffusion bond between the target, interlayer, and backing plate.

In the preferred HIP process, the can assembly is subjected to a temperature of about 350° C., at a pressure of 15 ksi for a period of about three hours. Diffusion bonds having tensile strengths as great as about 14 ksi between Cu target and Al backing plate have been achieved in accordance with this method. Additionally, this method does not result in excessive recrystallization or abnormal grain growth of Cu target. The average grain size of copper targets, bonded in accordance with the invention, was found to be on the order of about 15–20 microns.

Diffusion bonding of cobalt to Al 6061 targets in accordance with the invention has also resulted in increased tensile bond strength of about 14 ksi and cobalt targets bonded in accordance with the methods exhibit at least about a 60% magnetic pass through flux, and most have obtained a 65% magnetic pass through flux.

Additional details pertaining to the hot isostatic pressing methods which may be employed are set forth in U.S. Pat. Nos. 5,234,487 and 5,230,459, of common assignment herewith. The disclosures of these patents are incorporated herein by reference.

Another method for forming the desired diffusion bond is vacuum hot pressing in which the preheated target, interlayer, and backing plate are placed in a vacuum chamber and then pressed to promote bonding. The pressure applied during the bonding operation may vary over a wide range. In addition to vacuum hot pressing, hot pressing may also be conducted in the presence of a reducing gas or an inert gas.

Copper targets have been bonded to Al 6061 backing plates in accordance with the invention and cobalt targets have been successfully diffusion bonded to Al 6061 backing plates in accordance with HIPing conditions conducted at about 350° C. at pressures of 15 ksi for a time period of about three hours. These time, temperature and pressure conditions are therefore preferred.

Although the use of silver and silver alloy interlayers is preferred, other interlayer materials may be utilized, such as gold, palladium, and/or platinum.

Turning now to FIG. 1 there is shown, in perspective, a schematic diagram of a low temperature diffusion bonded sputter target/backing plate assembly in accordance with the invention. Here, the sputter target assembly 10 includes a target 12 which is bonded to the backing plate 16 via the use of an intermediate interlayer 14. The bonds between the target and the interlayer and the backing plate are of the interdiffusion type, wherein the target plate 12 is joined to the interlayer 14 and the interlayer 14 is joined to the backing plate 16.

EXAMPLES

The invention will now be further described with respect to the following examples of specific embodiments. These are illustrative and not to be construed as limiting the invention.

Example 1

Copper Targets

5N Cu targets were diffusion bonded to Al 6061 alloy backing plates. Ag interlayers were applied to the bonding surfaces of the backing plates by a sputter deposition process. These assemblies were diffusion bonded by HIPing at a temperature of 350° C. at 15 ksi for a period of about three hours.

The grain sizes of the targets in the diffusion bonded assemblies were measured and were found to be in the range of 15–20 microns thereby demonstrating that undesirable grain growth had not occurred during the bonding process. Tensile tests on the diffusion bonded assemblies demonstrated that the bond strengths averaged about 14 ksi.

Example 2

Cobalt Targets

Cobalt targets were diffusion bonded to Al 6061 alloy backing plates with an Ag interlayer deposited on the backing plates via sputtering. The assemblies were diffusion bonded by HIPing at 350° C. at 15 ksi for a period of about three hours. Bond strengths on the average of about 14 ksi resulted, and the magnetic pass through fluxes of the Co targets were measured and averaged about 65%.

Example 3

Comparisons

Figure 2:
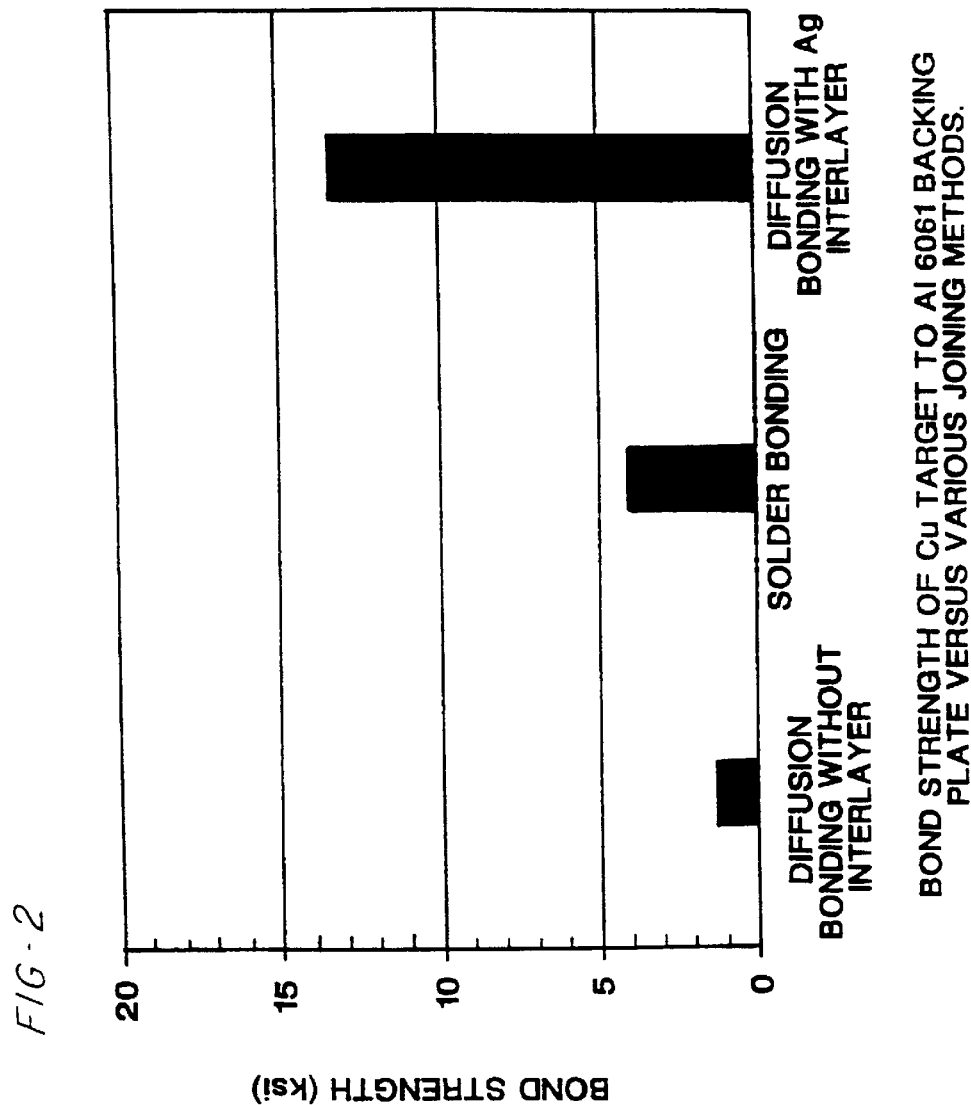
FIG. 2 is a graphical representation showing bonding strength of target/backing plate assemblies prepared in accordance with the invention and those prepared in accordance with conventional bonding techniques.

FIG. 2 shows comparison in bond strengths between a Cu target/Al 6061 diffusion bonded assembly without the use of an interlayer; a conventionally solder bonded Cu/Al 6061 assembly and a Cu/Al 6061 assembly bonded in accordance with Example 1. The assembly bonded without an interlayer was HIPed under the same time, temperature and pressure conditions specified above in Example 1. For the solder bonding comparison, a conventional Sn/Ag solder was used.

Figure 3:
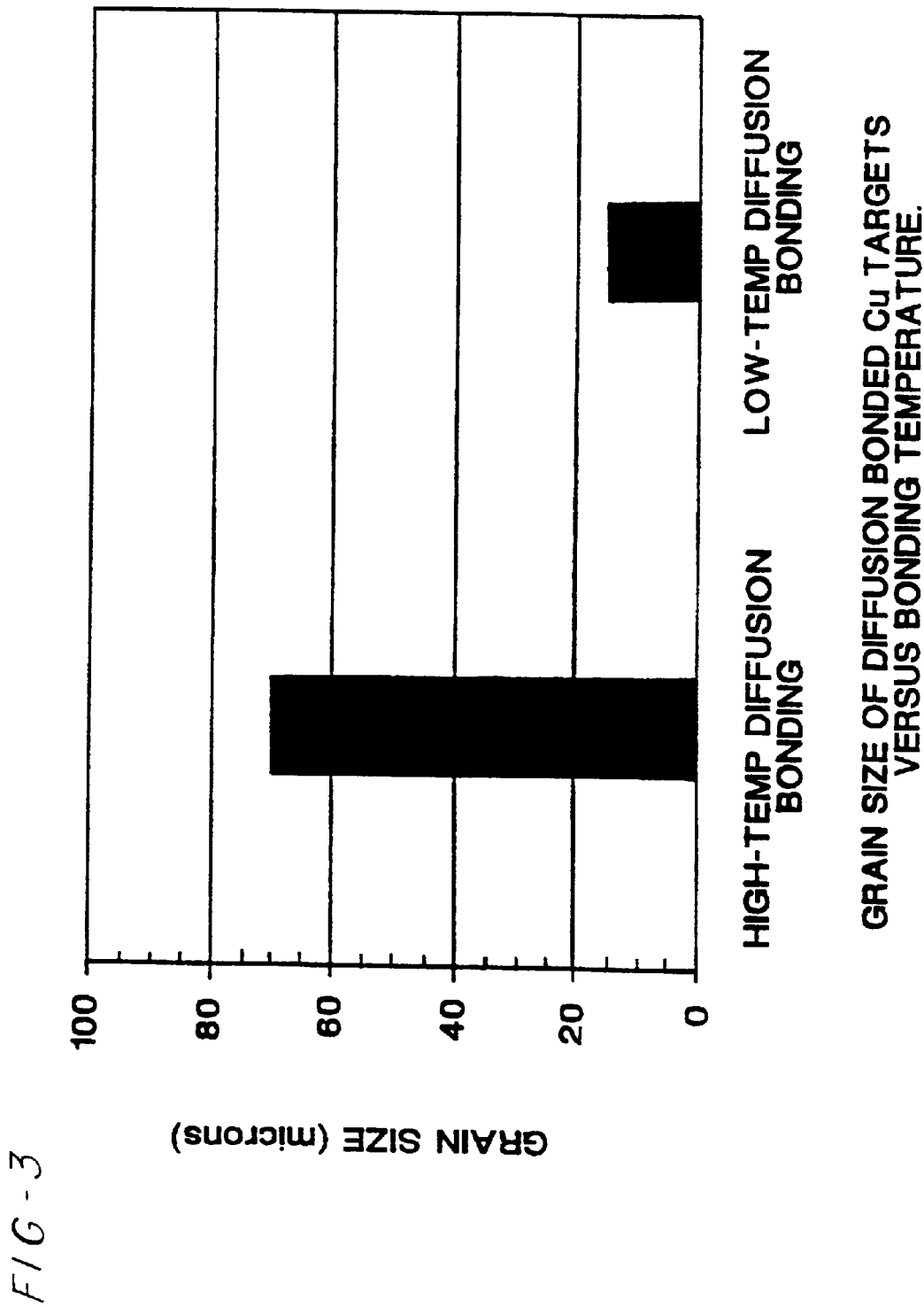
FIG. 3 is a graphical representation showing average grain size of Cu targets bonded to a backing plate in accordance with the invention and those prepared by high temperature diffusion bonding.

FIG. 3 depicts the average grain size of Cu targets bonded to an Al 6061 alloy backing plate (i.e., without an interlayer) via a conventional high-temperature diffusion bonding of the target to backing plate conducted under HIPing conditions of 450° C., 3 hours, 15 ksi. This shows that undesirable grain growth of the Cu target occurred during the bonding step. In contrast as shown in the graph, the average grain size of Cu targets bonded in accordance with the Example 1 procedure is less than 20 microns.

While I have shown and described herein certain embodiments of the present invention, it is intended that those be covered as well any change or modification therein which may be made without departing from the spirit and scope of the invention as defined in the appended claims.

What is claimed is:

1. A method of forming a bonded sputter target/backing plate combination comprising:

(a) providing a target having a bonding surface thereon wherein said target is composed of a metal selected from Co and alloys thereof;

(b) providing a backing plate having a bonding surface thereon wherein said backing plate is composed of a metal selected from the group consisting of Al and Cu and alloys thereof;

c) positioning said target and backing plate so that said target bonding surface and said backing plate bonding surface are adjacent each other.

(d) providing a bond interlayer between said bonding surfaces of said target and said backing plate to form an assembly, said bond interlayer comprising a metal selected from group Ib metals and their alloys; and (e) subjecting said assembly to temperature and pressure consolidation conditions to diffusion bond said target and backing plate together, said temperature being between about 190° C. - about 400° C.

2. Method as recited in claim 1 wherein said bond interlayer is a metallic foil having a thickness of about 5 to about 100 microns.

3. Method as recited in claim 1 wherein said interlayer is applied by providing a coating to at least one of said bonding surfaces.

4. Method as recited in claim 3 wherein said coating is applied by sputter coating.

5. Method as recited in claim 3 wherein said coating is applied by plasma spraying.

6. Method as recited in claim 3 wherein said coating is applied by electroplating.

7. Method as recited in claim 1 further comprising roughening at least one of said bonding surfaces prior to said step (e).

8. Method as recited in claim 1 wherein said step (e) comprises hot isostatic pressing (HIP).

9. Method as described in claim 1 wherein said step (e) comprises vacuum hot pressing.

10. Method as recited in claim 1 wherein said pressure in said step (e) is about 10–30 ksi.

11. Method as recited in claim 1 wherein said temperature in said step (e) is about 250° C.–about 400° C.

12. Method as recited in claim 1 wherein after said step (e) said target has a magnetic pass through flux of greater than about 60%.

13. Method as recited in claim 12 wherein said magnetic pass through flux is greater than about 65%.

14. Sputter target assembly made by any one of the preceding claims.

15. Sputter target assembly including a target consisting essentially of Co or Co alloy, a backing plate, and an interlayer of Ag or Ag alloy between said target and said backing plate, said target having a magnetic pass through flux of about 60% or greater.

16. Sputter target assembly as recited in claim 15 wherein said backing plate includes Al or Al alloy or Cu or Cu alloy, and wherein said target and said backing plate are diffusion bonded to each other along said interlayer, said target having a magnetic pass through flux of about 65% or greater.

* * * * *